US008623152B2

(12) United States Patent
O'Donnell et al.

(10) Patent No.: US 8,623,152 B2
(45) Date of Patent: Jan. 7, 2014

(54) REDUCTION OF ENTRANCE AND EXIT MARKS LEFT BY A SUBSTRATE-PROCESSING MENISCUS

(71) Applicants: Robert O'Donnell, Fremont, CA (US); Mike Ravkin, Sunnyvale, CA (US); John de Larios, Palo Alto, CA (US)

(72) Inventors: Robert O'Donnell, Fremont, CA (US); Mike Ravkin, Sunnyvale, CA (US); John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/671,459

(22) Filed: Nov. 7, 2012

(65) Prior Publication Data
US 2013/0061879 A1  Mar. 14, 2013

Related U.S. Application Data

(60) Division of application No. 12/725,422, filed on Mar. 16, 2010, now Pat. No. 8,317,932, which is a division of application No. 11/612,868, filed on Dec. 19, 2006, now Pat. No. 7,703,462, which is a continuation-in-part of application No. 11/537,501, filed on Sep. 29, 2006, now Pat. No. 7,946,303.

(51) Int. Cl.
*B08B 1/02* (2006.01)

(52) U.S. Cl.
USPC ............................. 134/32; 134/18; 15/1

(58) Field of Classification Search
None
See application file for complete search history.

(56) References Cited

U.S. PATENT DOCUMENTS

2004/0069326 A1* 4/2004 Woods et al. .................... 134/32
2005/0176252 A1* 8/2005 Goodman et al. ............ 438/692

* cited by examiner

*Primary Examiner* — Eric Golightly
(74) *Attorney, Agent, or Firm* — Martine Penilla Group, LLP

(57) ABSTRACT

A substrate is moved in a linear direction simultaneously between a processing face of an upper proximity head and a processing face of a lower proximity head. As the substrate is moved, a first meniscus of processing liquid is generated between the processing face of the upper proximity head and a top surface of the substrate, and a second meniscus of processing liquid is generated between the processing face of the lower proximity head and a bottom surface of the substrate. The first meniscus has a meniscus protrusion extending in the linear direction in which the substrate is moved and positioned on a trailing side of the first meniscus relative to the linear direction in which the substrate is moved. The meniscus protrusion is centered on the substrate relative to a diameter of the substrate as measured perpendicular to the linear direction in which the substrate is moved.

10 Claims, 8 Drawing Sheets

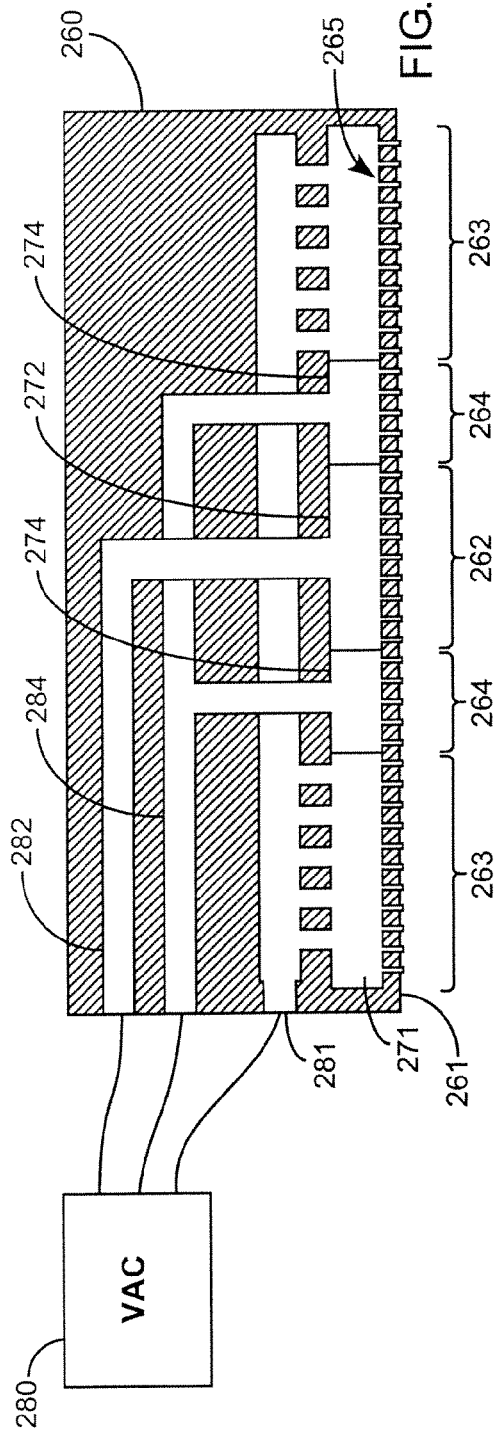
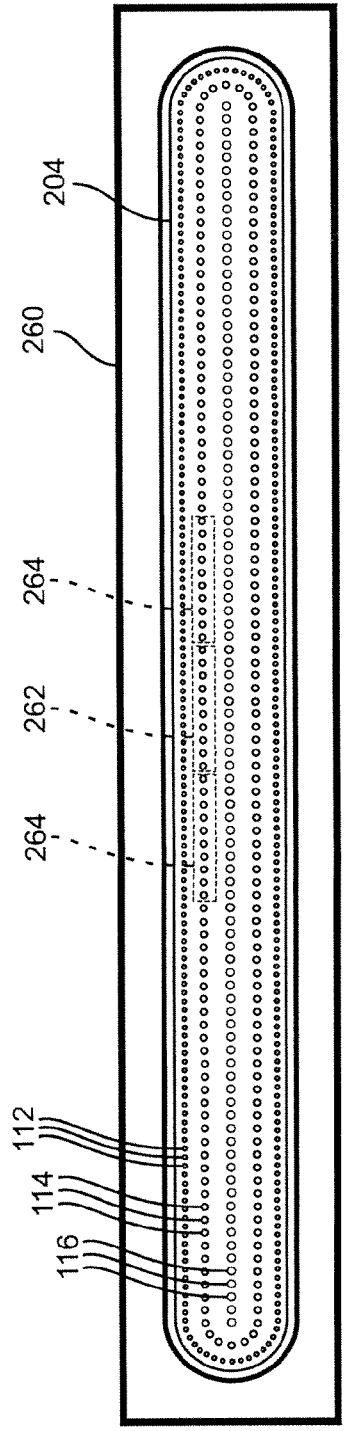

REDUCTION OF ENTRANCE AND EXIT MARKS LEFT BY A SUBSTRATE-PROCESSING MENISCUS

CLAIM OF PRIORITY

This application is a divisional application of U.S. patent application Ser. No. 12/725,422, filed on Mar. 16, 2010, entitled "Reduction of Entrance and Exit Marks Left by a Substrate-Processing Meniscus," issued as U.S. Pat. No. 8,317,932, on Nov. 27, 2012, which is a divisional application of U.S. patent application Ser. No. 11/612,868, filed on Dec. 19, 2006, entitled "Reduction of Entrance and Exit Marks Left by a Substrate-Processing Meniscus," issued as U.S. Pat. No. 7,703,462, on Apr. 27, 2010, which is a continuation-in-part application of U.S. patent application Ser. No. 11/537,501, filed on Sep. 29, 2006, entitled "Carrier For Reducing Entrance And/Or Exit Marks Left By A Substrate-Processing Meniscus," issued as U.S. Pat. No. 7,946,303, on May 24, 2011. Each of the above-identified patent applications is incorporated herein by reference in its entirety.

CROSS-REFERENCE TO RELATED APPLICATIONS

The present Application is related to the following U.S. patents and U.S. patent applications, all of which are incorporated herein by reference in their entirety: U.S. Pat. No. 6,488,040, issued on Dec. 3, 2002 to De Larios, et al. and entitled, "Method And Apparatus For Drying Semiconductor Wafer Surfaces Using A Plurality Of Inlets And Outlets Held In Close Proximity To The Wafer Surfaces;" U.S. patent application Ser. No. 10/330,843, filed on Dec. 24, 2002 and entitled, "Meniscus, Vacuum, IPA Vapor Drying Manifold;" U.S. patent application Ser. No. 10/330,897, also filed on Dec. 24, 2002, entitled, "System For Substrate Processing With Meniscus, Vacuum, IPA Vapor, Drying Manifold;" U.S. patent application Ser. No. 10/404,692, filed Mar. 31, 2003 and entitled, "Methods And Systems For Processing A Substrate Using A Dynamic Liquid Meniscus;" and U.S. patent application Ser. No. 10/817,620, which was filed on Apr. 1, 2004, entitled, "Substrate Meniscus Interface And Methods For Operation."

BACKGROUND

In the semiconductor chip fabrication industry, it is necessary to clean and dry a substrate after a fabrication operation has been performed that leaves unwanted residues on the surfaces of the substrate. Examples of such a fabrication operations include plasma etching (e.g., tungsten etch back (WEB)) and chemical mechanical polishing (CMP). In CMP, a substrate is placed in a holder that pushes a substrate surface against a polishing surface. The polishing surface uses a slurry which consists of chemicals and abrasive materials. Unfortunately, the CMP process tends to leave an accumulation of slurry particles and residues on the substrate surface. If left on the substrate, the unwanted residual material and particles may defects. In some cases, such defects may cause devices on the substrate to become inoperable. Cleaning the substrate after a fabrication operation removes unwanted residues and particulates.

After a substrate has been wet cleaned, the substrate must be dried effectively to prevent water or cleaning fluid, (hereinafter, "fluid") remnants from leaving residues on the substrate. If the cleaning fluid on the substrate surface is allowed to evaporate, as usually happens when droplets form, residues or contaminants previously dissolved in the fluid will remain on the substrate surface after evaporation and can form spots. To prevent evaporation from taking place, the cleaning fluid must be removed as quickly as possible without the formation of droplets on the substrate surface. In an attempt to accomplish this, one of several different drying techniques are employed such as spin-drying, IPA, or Marangoni drying. All of these drying techniques utilize some form of a moving liquid/gas interface on a substrate surface, which, if properly maintained, results in drying of a substrate surface without the formation of droplets. Unfortunately, if the moving liquid/gas interface breaks down, as often happens with all of the aforementioned drying methods, droplets form and evaporation occurs resulting in contaminants being left on the substrate surface.

In view of the foregoing, there is a need for improved cleaning systems and methods that provide efficient cleaning while reducing the likelihood of marks from dried fluid droplets.

SUMMARY

Broadly speaking, the present invention fills these needs by providing various techniques for reduction of entrance and exit marks caused by dried fluid droplets left by a substrate-processing meniscus.

It should be appreciated that the present invention can be implemented in numerous ways, including as a process, an apparatus, a system, a device, or a method. Several inventive embodiments of the present invention are described below.

In one embodiment, a proximity head for generating and maintaining a meniscus for processing a substrate is provided. The proximity head includes a plurality of meniscus nozzles formed on a face of the proximity head, the nozzles being configured to supply liquid to the meniscus, a plurality of vacuum ports formed on the face of the proximity head, the vacuum ports being arranged to completely surround the plurality of meniscus nozzles. A plurality of main gas nozzles may be formed on the face of the proximity head, the main gas nozzles at least partially surrounding the vacuum ports. The proximity head further includes means for reducing a size and frequency of entrance and/or exit marks at a leading edge and a trailing edge on the substrate by aiding and encouraging liquid from the meniscus to evacuate a gap between the substrate and the carrier.

In another embodiment, a method for processing a substrate using a meniscus formed by upper and lower proximity heads is provided. In the method the substrate is placed on a carrier, which is passed through a meniscus generated between upper and lower proximity heads. The carrier has an opening sized for receiving the substrate and a plurality of support pins for supporting the substrate within the opening, the opening being slightly larger than the substrate such that a gap exists between the substrate and the opening. Each of the upper and lower proximity heads include a plurality of meniscus nozzles formed on a face of the proximity head, the nozzles being configured to supply liquid to the meniscus; a plurality of vacuum ports formed on the face of the proximity head, the vacuum ports being arranged to completely surround the plurality of meniscus nozzles; and a plurality of main gas nozzles formed on the face of the proximity head, the main gas nozzles at least partially surrounding the vacuum ports. The method further includes a step for reducing a size and frequency of at least one of entrance or exit marks on substrates by encouraging liquid from the meniscus to evacuate the gap using the upper and lower proximity heads.

Since introduction by the present Assignee of the use of a moving meniscus generated by a proximity head for use in cleaning, processing, and drying semiconductor wafers, it has become possible to wet and dry a substrate with a very low risk of droplets forming on the substrate surface. This technology has been very successful at preventing any droplets from being left on the active device region of the wafer after the meniscus is removed. However, the meniscus does occasionally tend to leave a small droplet at the entrance and exit points at the leading and trailing edges of the substrate on the exclusion zone as the substrate passes through the meniscus. The exclusion zone is a margin that extends from the active device region to the edge of the substrate, where microelectronic structures are not formed. On occasion, entrance and exit marks can become mains surface marks, especially on hydrophilic wafers. Therefore, it is preferable that instances of such entrance and exit marks are reduced or eliminated.

The advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 9A and 9B show an exemplary embodiment of a proximity head having means for reducing entrance and exit mark size and frequency.

DETAILED DESCRIPTION

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention. The term, "meniscus," as used herein, refers to a volume of liquid bounded and contained in part by surface tension of the liquid. The meniscus is also controllable and can be moved over a surface in the contained shape. In specific embodiments, the meniscus is maintained by the delivery of fluids to a surface while also removing the fluids so that the meniscus remains controllable. Furthermore, the meniscus shape can be controlled by precision fluid delivery and removal systems that are in part interfaced with a controller a computing system, which may be networked.

Figure 1:
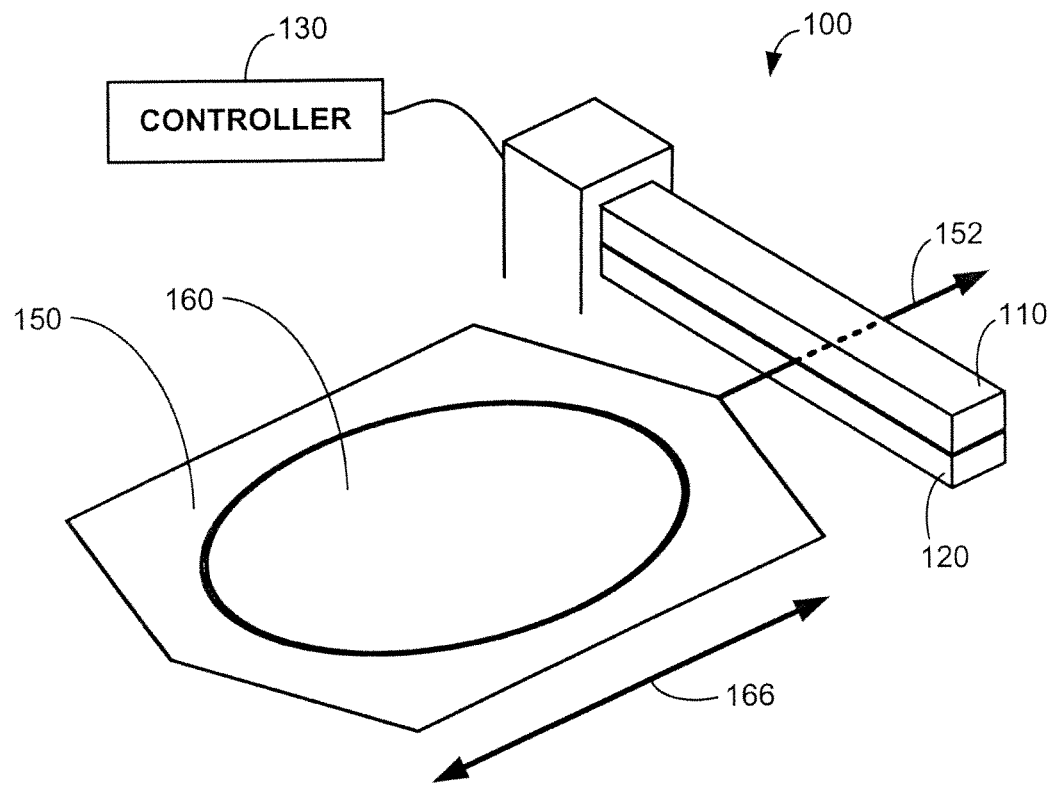
FIG. 1 shows a perspective view of an exemplary implementation of a proximity head apparatus.

FIG. 1 is a perspective view of an exemplary implementation of a proximity head apparatus 100. In this example, substrate 160 is positioned within a carrier 150 which passes between upper proximity head 110 and lower proximity head 120 in the direction of arrow 152. Upper and lower proximity heads 110, 120, form a meniscus of fluid between them. Carrier 150 may be connected to some apparatus (not shown) for causing carrier 150 to move between upper and lower proximity heads 110, 120 in the direction of arrow 166. In one embodiment, a substrate 160 is deposited on carrier 150 at a first location on one side of proximity heads 110, 120, and removed when carrier 150 arrives at a second location on an opposite side of proximity heads 110, 120. Carrier 150 may then pass back through proximity heads 110, 120, or over, under, or around proximity heads 110, 120, back to the first location, where a next substrate is deposited, and the process is repeated.

It should be noted that, while in the example shown in FIG. 1, the substrate moves through proximity heads 110, 120 in the direction of arrow 152, it is also possible for the substrate to remain stationary while the proximity heads 110, 120, pass over and under the substrate, so long as the substrate moves with respect to the proximity heads. Furthermore, the orientation of the substrate as it passes between the proximity heads is arbitrary. That is, the substrate is not required to be oriented horizontally, but can instead be vertically oriented or at any angle.

In certain embodiments, a controller 130, which may be a general purpose or specific purpose computer system whose functionality is determined by logic circuits or software, or both, controls the movement of carrier 150 and the flow of fluids to upper and lower proximity heads 110, 120.

Figure 2:
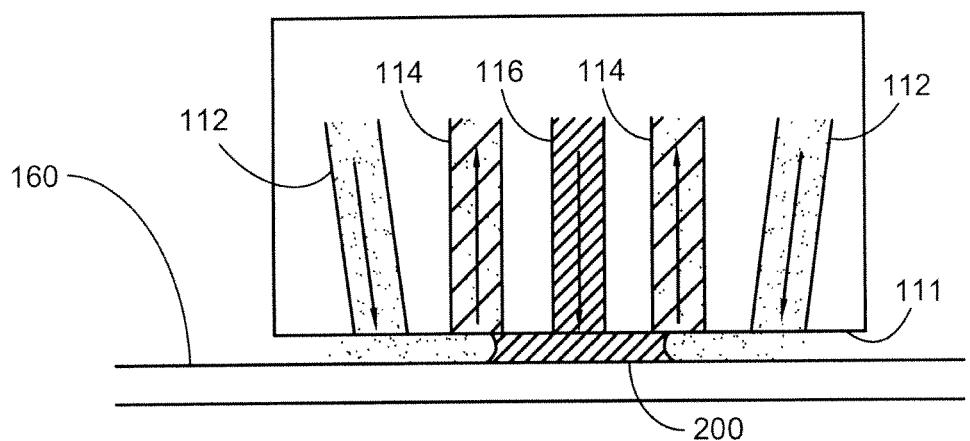
FIG. 2 shows a schematic representation of an upper proximity head.

FIG. 2 shows a schematic representation of upper proximity head 110. Proximity head includes a plurality of central meniscus nozzles 116 formed in face 111 of proximity head 110 through which a liquid is supplied that forms meniscus 200. The liquid may be deionized water, a cleaning solution, or other liquid designed to process, clean, or rinse substrate 160. A plurality of ports 114 apply a vacuum at a perimeter of meniscus 200. Vacuum ports 114 aspirate liquid from meniscus 200 and surrounding fluid, such as air or other gas supplied by main gas nozzles 112. In certain embodiments, main gas nozzles 112 surround vacuum ports 114 and supply isopropyl alcohol vapor, nitrogen, a mixture thereof, or other gas or gases or gas/liquid fluids. Depending on the implementation, main gas nozzles 112 and fluid supplied therefrom may be provided to aid in maintaining a coherent liquid/gas interface at the surface of meniscus 200. In one embodiment, main gas nozzles 112 are absent or are not used. In another embodiment, main gas nozzles 112 supply carbon dioxide ($CO_2$) or a mixture of $N_2$ and isopropyl alcohol (IPA) vapor. The lower proximity head 120, not shown in FIG. 2, may be provided as a minor image to the upper proximity head, and may operate in a similar manner. More details relating to proximity head structure and operation are incorporated by reference in the Cross Reference to Related Art section above. In particular, U.S. patent application Ser. Nos. 10/261,839, 10/330,843, and 10/330,897 are referenced for additional details relating to proximity head structure and operation.

Figure 3A:
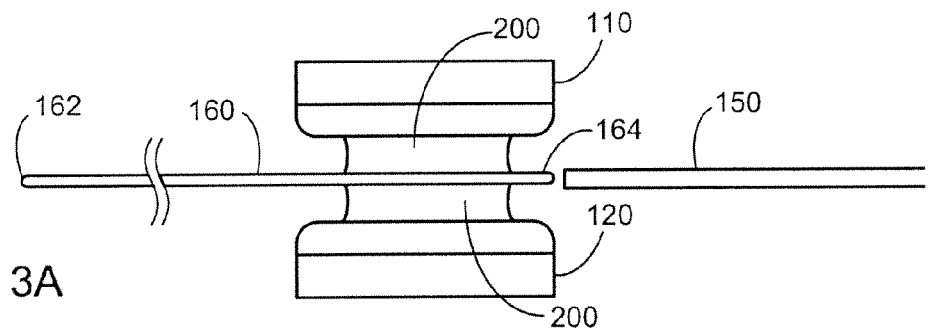
FIGS. 3A, 3B, 3C, and 3D illustrate a substrate exiting a meniscus generated by upper and lower proximity heads.

FIGS. 3A through 3D illustrate a substrate 160 exiting meniscus 200 generated by upper and lower proximity heads 110, 120. In FIG. 3A, substrate 160 extends all the way through meniscus 200 such that its leading edge 162 and trailing edge 164 lie on opposite sides of meniscus 200. It should be noted that, typically, substrate 160 will be circular and while carrier 150 is shown outside of meniscus 200, parts of carrier 150 may be in contact with meniscus 200, although not visible in this Figure.

Figure 3B:
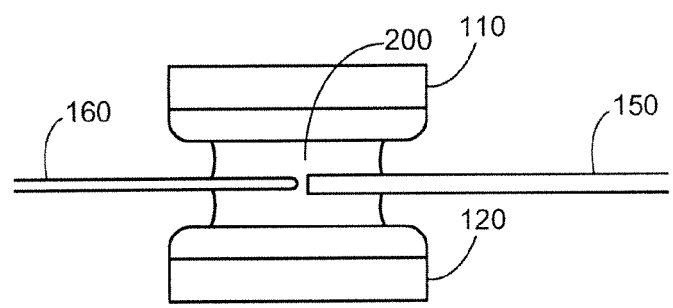

In FIG. 3B, meniscus 200 is transitioning from substrate 160 to carrier 150. Carrier 150 may be slightly thicker in cross section than substrate 160. For example, substrate 160 may be about 0.80 mm thick whereas the carrier may be about 1.5 mm thick. Thus, as meniscus 200 transitions onto carrier 150, a certain amount of meniscus liquid is displaced by carrier 150.

Figure 3C:
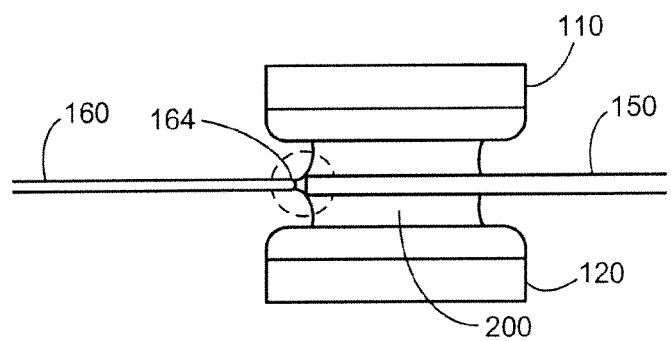

In FIG. 3C, meniscus 200 is transitioning completely off substrate 160 and onto carrier 150. At this time, the trailing edge of meniscus 200 is still in contact with trailing edge 164 of substrate 160. Forces acting on meniscus 200 at this point in time is described with reference to FIG. 5 below.

Figure 3D:
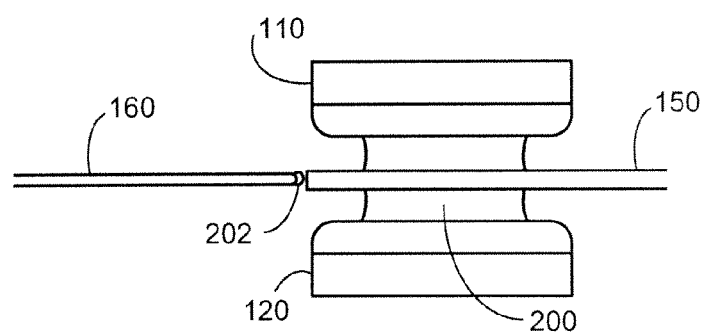

In FIG. 3D, the meniscus has completely transitioned off of substrate 160, leaving a small droplet 202 of meniscus liquid on the exclusion zone of substrate 160 at the trailing edge 164 of substrate 160. Droplet 202, if allowed to dry can leave a spot formed of dissolved or entrained elements, the spot being referred to herein as an exit mark. If the substrate surface is hydrophilic, droplet 202 can migrate to the active device region of the substrate, which can cause defects in devices formed thereon. A number of factors are believed to contribute to the presence and size of small droplet 202 at the trailing edge 164 of substrate 160. It should be noted that an entrance mark at leading edge 162 can be formed in a similar manner as leading edge 162 exits meniscus 200.

Figure 4:
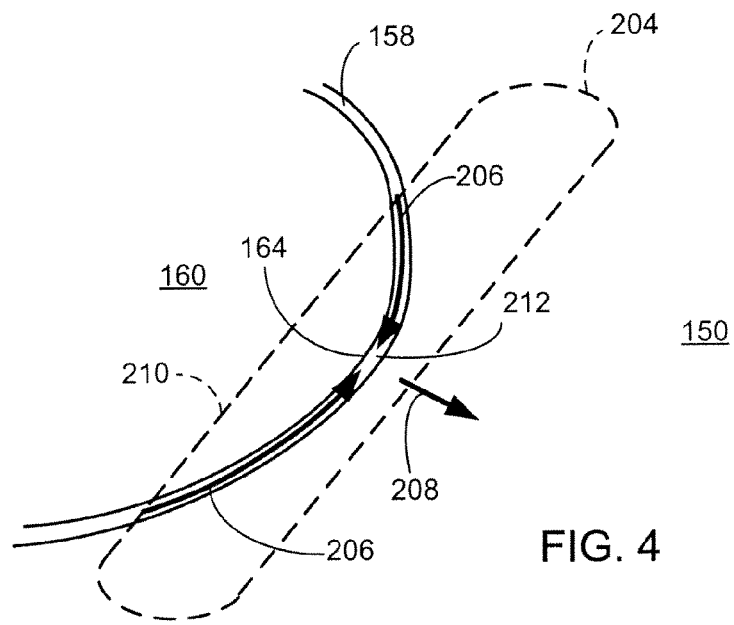
FIG. 4 shows a perspective view of a gap between a carrier and a substrate.

FIG. 4 shows a perspective view of a gap 158 between a carrier 150 and a substrate 160. Meniscus perimeter 204 shows the area of contact of the meniscus with carrier 150 and substrate 160. The meniscus is traveling in the direction indicated by arrow 208. As the meniscus transitions off of waver 160, meniscus fluid in gap 158 is swept by the edge of the meniscus along the direction of arrows 206. As the trailing edge 210 of meniscus perimeter 204 reaches trailing edge 164 of substrate 160, fluid is directed toward a point 212 in gap adjacent to the substrate's trailing edge 164. It should be recognized that fluid in gap 158 is constantly flowing out of gap 158 as the meniscus transitions onto carrier 150. Therefore, the fluid is not expected to literally follow arrows 206, but rather that a vector component of the direction of flow lies on arrows 206, resulting in a build-up of fluid at point 212.

Figure 5:
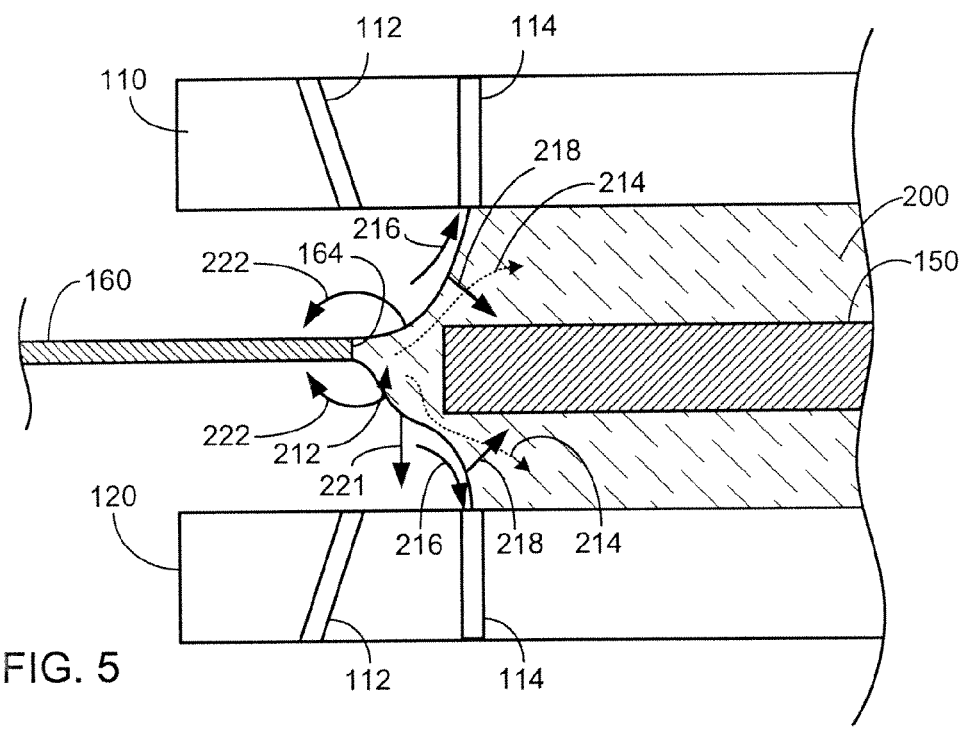
FIG. 5 shows a cross section view of a meniscus as it is completing transition onto a carrier.

FIG. 5 shows a cross section view of meniscus 200 at point 212 as it is completing transition onto carrier 150. At this point, meniscus 200 is still attached to trailing edge 164 of substrate 160. Carrier 150 may be somewhat thicker than substrate 160, inhibiting the flow of liquid away from substrate 160 along arrows 214. Vacuum ports 114 draw fluid including meniscus liquid and surrounding gas, exerting a force on meniscus liquid indicated by arrows 216. An additional force may be exerted by fluid exiting main gas nozzles 112 (FIG. 2) which, if provided, push inward against the gas/liquid interface of meniscus 200 as shown by arrows 218. A gravitational force 221 is also exerted against meniscus 200. And, if substrate 160 is hydrophilic, then an attraction to meniscus liquid can cause hydrogen bonding forces to pull water back onto substrate 160, as represented by arrows 222.

Figure 6A:
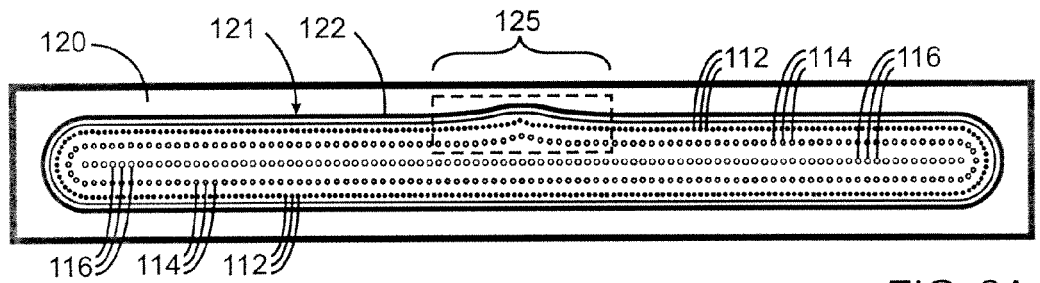
FIG. 6A shows a top view of the lower proximity head having means for reducing entrance and exit mark size and frequency.

FIG. 6A shows a face 121 of lower proximity head 120 having means for reducing entrance and exit mark size and frequency by enhancing the flow of meniscus liquid from the carrier-substrate gap as the meniscus transitions off of the substrate. As described above with reference to FIG. 2, lower proximity head 120 includes a plurality of centrally disposed meniscus nozzles 116 for supplying meniscus liquid, a plurality of vacuum ports 114 disposed so that they completely surround meniscus nozzles 116. Vacuum ports 114 aspirate meniscus liquid and surrounding gas. Optionally, a plurality of main gas nozzles 112 at least partially surround vacuum ports 114 and supply a gas or gas/liquid mixture to help maintain the integrity of the gas/liquid interface of the meniscus. Meniscus nozzles 116, vacuum ports 114, and, optionally, main gas nozzles 112 are formed in face 121 of proximity head 120. In one embodiment, a means for reducing the size and frequency of entrance and exit marks is provided by a centrally located protrusion on the trailing side 122 of the meniscus. The arrangement of vacuum ports 114 determines the shape of the meniscus. FIG. 6 shows lower proximity head 120 forming the centrally located protrusion by positioning vacuum ports 114 and adjacent main gas nozzles 112 farther from an axis defined by meniscus nozzles 116 at a center portion 125 of lower proximity head 120. A corresponding central protrusion is formed on an upper proximity head 110 (FIG. 1) so that they both generate a centrally located meniscus protrusion on the trailing side of the meniscus.

Figure 6C:
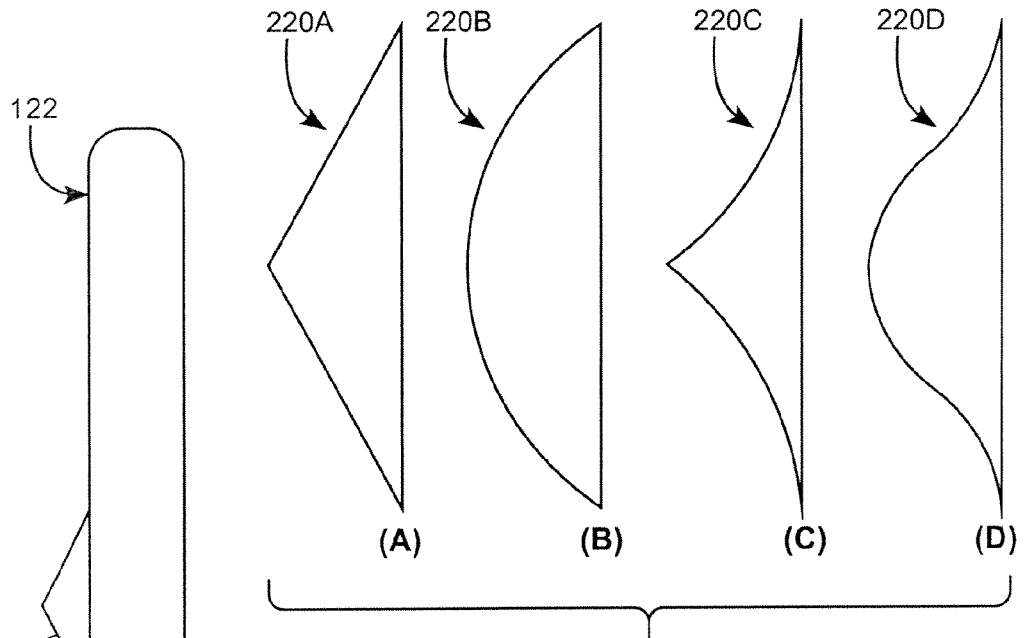
FIGS. 6B, 6C, and 6D illustrate various meniscus protrusion sizes and shapes.
Figure 6B:
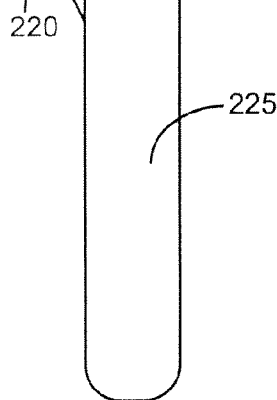
Figure 6D:
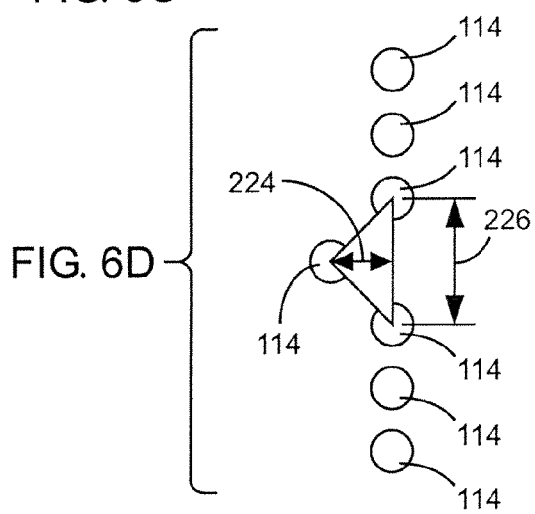

FIG. 6B shows an outline of exemplary meniscus configuration formed by the proximity head of FIG. 6A. The meniscus includes a main portion 225 and a protrusion 220. The protrusion 220 may have various shapes. For example, as shown in FIG. 6C, the protrusion 220A has straight leading, the protrusion 220B has two convex leading edges extending smoothly from the meniscus to a central point, the protrusion 220C has concave leading edges, and the protrusion 220D has a complex leading edge shape. In one embodiment, the leading edges are concave as presented in 220C, with the leading edges having the same radius of curvature as the substrate 160 (FIG. 7).

In FIG. 6C, a minimum protrusion size is shown having a protrusion extension 224 equal to the distance between two adjacent vacuum ports and a protrusion width 226 equal to the distance between three adjacent vacuum ports. However, the protrusion can be of any suitable size. In one embodiment, for example, the protrusion has an extension equal to a length defined by the distance of 6 adjacent vacuum ports and a width defined by the distance of 12 vacuum ports, with each vacuum port being about 0.06 inches in diameter and having a 0.12 inch pitch (center-to-center spacing).

Figure 7:
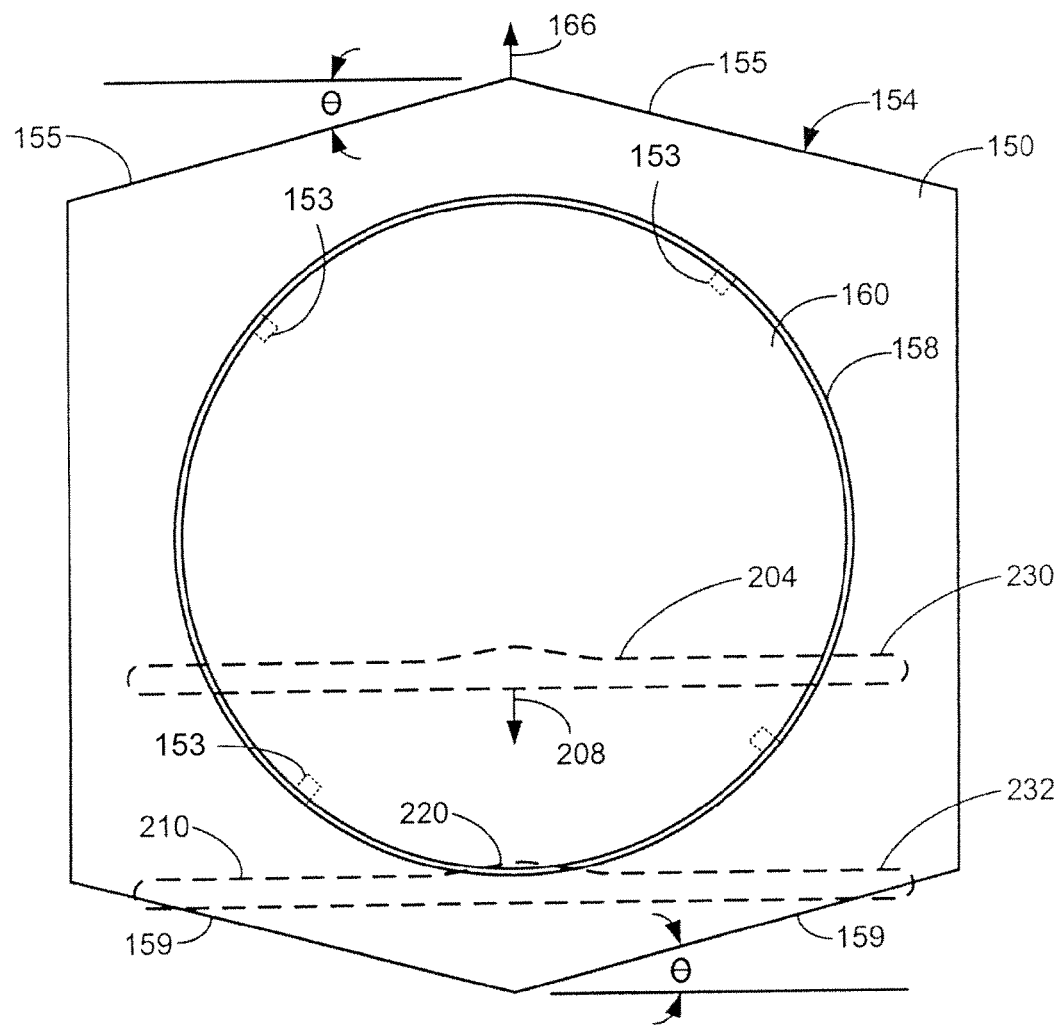
FIG. 7 shows a plan view of a carrier, substrate, and meniscus perimeter.

FIG. 7 shows a plan view of carrier 150, substrate 160, and meniscus perimeter 204 at a first position 230 and at a second position 232. Carrier 150 moves in a direction indicated by arrow 166 and/or meniscus moves in a direction indicated by arrow 208. Carrier 150 includes a plurality of support pins 153, each having substrate support and centering features (not shown), to ensure a uniform substrate-carrier gap 158 between substrate 160 and carrier 150. In one embodiment, carrier 150 has sloped edges at the leading side 154 and trailing side 156 to prevent abrupt changes in the volume of meniscus liquid as carrier 150 enters and exits the meniscus. For example, carrier 150 has six sides with two leading edges 155 each at an angle θ from transverse and together forming a centrally-located point, and corresponding trailing edges 159 each forming an angle θ to the transverse direction and together forming a centrally-located point. In one embodiment, θ is about 15 degrees. Other shapes that don't result in a rapid displacement of meniscus liquid are also possible, such as a trapezoid or parallelogram, wherein leading and trailing edges are at an angle other than a right angle to the direction of travel of the carrier or are at an angle to (i.e., not parallel with) the leading and trailing edges of the meniscus.

At a certain point in time, the meniscus is located at position 230 and traveling in a direction 208 with respect to carrier 150. At a later time, the meniscus is located at position 232. At position 232, protrusion 220 extends across gap 158. Because of protrusion 220, the trailing edge 210 of meniscus perimeter 204 is not a straight line tangent to gap 158. As a result, fluid exiting point 212 (FIG. 4) has additional time to escape from gap 158 due to the presence of protrusion 220. Since the fluid has additional time to escape from gap 158, it is less likely to remain attached to substrate 160 and leave a mark.

Protrusion 220 can also be effective in reducing an entrance mark formed at a leading edge 162 of substrate 160. In one embodiment, a centrally-located indentation is formed on the leading edge of the meniscus (not shown) to further reduce instances of entrance marks. It should be noted that the shape of protrusion 220, including the width of protrusion 220 and the depth of protrusion 220, that is the amount of extension of protrusion 220, may vary depending on implementation, but in one embodiment, is sufficiently narrow and provides sufficient extension to improve the flow of meniscus liquid from the carrier-substrate gap.

Figure 8A:
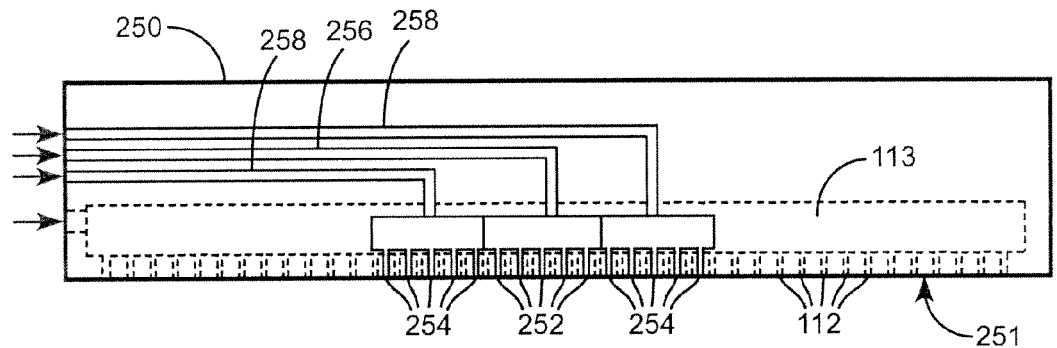
FIGS. 8A, 8B, and 8C show an exemplary embodiment of a proximity head having means for reducing entrance and exit mark size and frequency.
Figure 8B:
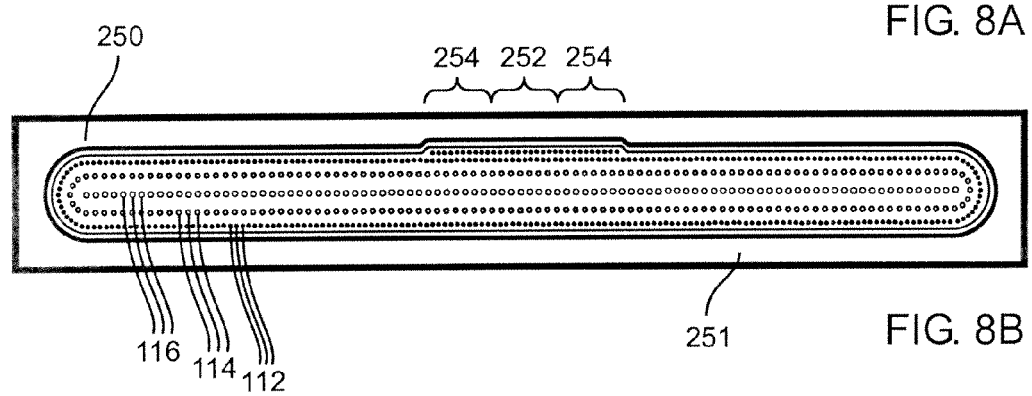
Figure 8C:
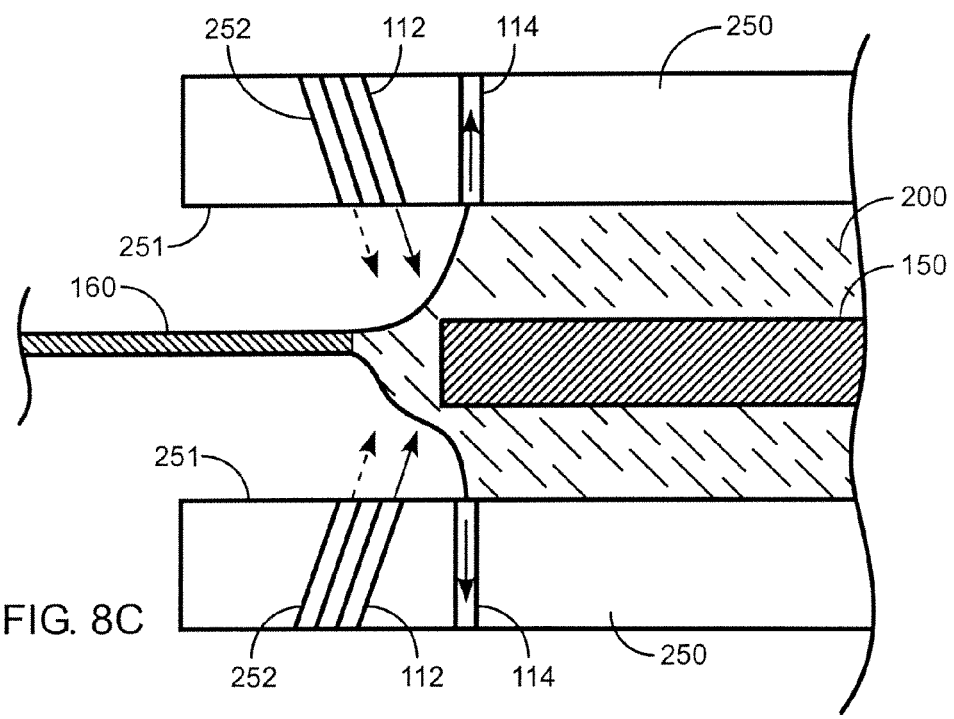

FIGS. 8A, 8B, and 8C show an exemplary embodiment of a proximity head 250 having means for reducing entrance and exit mark size and frequency by enhancing the flow of meniscus liquid from the carrier-substrate gap as the meniscus transitions off of the substrate. In particular, proximity head 250, which can be an upper or lower proximity head, includes centrally disposed gap evacuation gas nozzles 252 formed on face 251 to provide additional supply of gas to push against meniscus 200 as it transitions completely off of substrate 160, as best seen in FIG. 8C. As mentioned above with reference to FIG. 5, the meniscus touching substrate 160 and substrate-carrier gap 158 is subject to competing forces, including surface tension forces that both draw the meniscus onto the substrate and inhibit transitioning onto the carrier, suction forces drawing the meniscus off of both the substrate and carrier, and gravity, which pulls the meniscus liquid into substrate-carrier gap 158. In addition, a gas flow can exert positive pressure on meniscus 200, and therefore help counter surface tension forces which can result in entrance and exit marks. Main gas nozzles 112 deliver carbon dioxide or nitrogen and/or isopropyl alcohol vapor to the meniscus to aid in meniscus containment and wafer drying. However, main gas nozzles 112 cannot readily be used to aid in entrance and exit mark elimination because main gas nozzles 112, which are arranged around at least a portion of vacuum ports 114, affect the entire meniscus, or a substantial volume thereof. One or more gap evacuation gas nozzles 252, on the other hand, provide a localized "fan," or "curtain" of gas flow, which can be independently controlled, and therefore be selectively applied to the substrate/meniscus interface only in the areas of entrance and exit mark formation. By applying additional pressure against meniscus 200 just as the trailing edge of meniscus 200 transitions on or off of substrate 160 using gap evacuation gas nozzles 252 meniscus liquid exiting gap 158 is pushed back into the meniscus so that it does not stick to the wafer, thereby reducing the size and likelihood of entrance and exit mark formation, and prevent wafer defects.

In certain embodiments, a plurality of central fluid port zones provide for additional pressure during just prior and during transition by the trailing edge of the meniscus between substrate 160 and carrier 150. In this embodiment, one or more centrally disposed gap evacuation gas nozzles 252 are surrounded by one or more additional zones tertiary nozzles 254, visible in FIGS. 8A and 8B. Any number of zones can be provided, each being independently controlled by controller 130 (FIG. 1) to supply gas pressure against meniscus 200 at appropriate times during meniscus transition. Controller 130 may include a mechanical or computer initiated timing mechanism. For example, a mechanical timing mechanism may employ a proximity sensor (not shown) to activate gap evacuation gas nozzles 252 (or gap evacuation gas nozzles 252 and secondary gap evacuation nozzles 254), wherein the proximity sensor responds to a position of carrier 150 with respect to upper and lower proximity heads 110, 120 (FIG. 1). A computer initiated timing mechanism may include position information from a robotic actuating mechanism (not shown) used to convey carrier 150 through the meniscus.

FIGS. 9A and 9B show an exemplary embodiment of a proximity head 260 having means for reducing entrance and exit mark size and frequency by enhancing the flow of meniscus liquid from the carrier-substrate gap as the meniscus transitions off of the substrate. In particular, proximity head 260 includes a partitioned vacuum manifold to provide a plurality of vacuum port zones, each connected to an independent vacuum source. By providing an independent vacuum source to a central zone 262, which has vacuum ports formed into face 216 at a location corresponding to the trailing edge of the meniscus, vacuum shunting is minimized, which enhances flow of meniscus liquid exiting the carrier-substrate gap 158.

Vacuum shunting occurs when a few vacuum ports are overrun with liquid. In such cases, the pressure drop across faceplate 265 (FIG. 9A) may be insufficient to clear the liquid, causing gases and fluid from the meniscus to divert to nearby vacuum ports. When a significant volume of water is trapped between the wafer and carrier, vacuum shunting can occur just as the meniscus is transitioning completely off the substrate. This reduces the available suction at the exact spot where is most needed: at the trailing edge of the substrate as the substrate exits the meniscus. This reduced availability of vacuum can therefore reduce the removal of liquid from the substrate-carrier gap, which can lead to exit mark formation. A similar effect can occur at the leading edge of the substrate, which can cause an entrance mark to form.

By providing an independent vacuum source to a central zone 262 of vacuum ports centrally positioned on the trailing edge of the meniscus, vacuum shunting is minimized, which enhances flow of meniscus liquid exiting the carrier-substrate gap 158.

Referring to FIGS. 9A and 9B, a plurality of meniscus nozzles 116 formed into face 261 provide meniscus liquid to the meniscus 200 (FIG. 2). Surrounding meniscus nozzles 116 are vacuum ports 114, which aspirate a mixture of meniscus liquid and surrounding gas. At least partially surrounding vacuum ports 114, main gas nozzles 112 may be provided to supply gas or gas/liquid mixture, which can aid in maintaining meniscus integrity. In one embodiment, vacuum ports 114 are divided into a plurality of zones, including a first zone 262 centrally disposed along the trailing edge 204 of proximity head 260 and at least one additional zone 263, 264 comprising the remaining vacuum ports 114. The additional zone(s) can include a secondary zone 264 comprising a plurality of vacuum ports 114 on either side of first zone 262, and tertiary zone 263 comprising the remaining vacuum ports 114. Each zone 263, 262, 264 has a corresponding dedicated, independent manifold 271, 272, 274, and each manifold 271, 272, 274, is in fluid communication with a corresponding connection 281, 282, 284 to a vacuum source 280.

Figure 10:
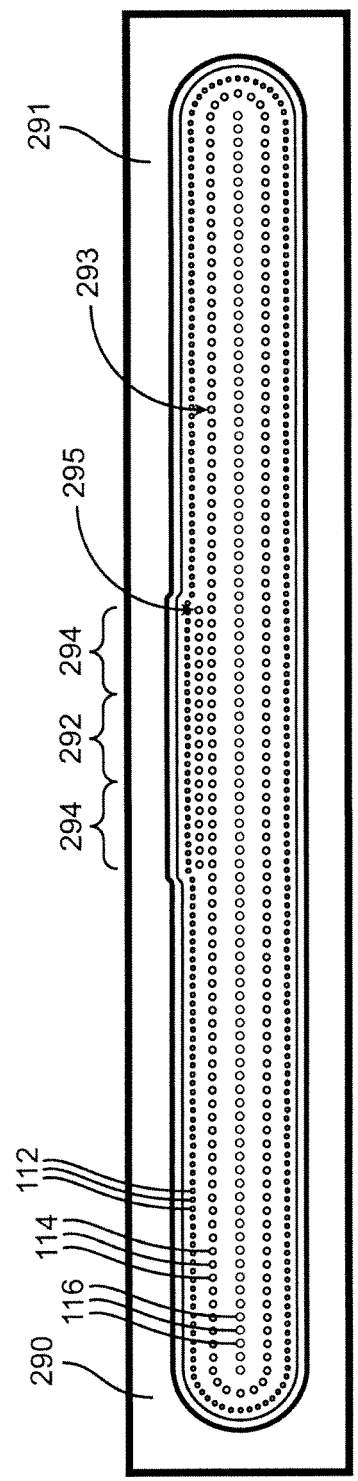
FIG. 10 shows another embodiment of a proximity head having means for reducing entrance and exit mark size and frequency.

FIG. 10 shows another embodiment of a proximity head having means for reducing entrance and exit mark size and frequency by enhancing the flow of meniscus liquid from the carrier-substrate gap as the meniscus transitions off of the substrate. Proximity head 290 includes a plurality of meniscus nozzles 116 formed into face 291 for supplying meniscus liquid. Surrounding meniscus nozzles 116 on face 291 is a plurality of vacuum ports 114 for aspirating meniscus liquid and surrounding gases. Vacuum ports 114 includes a first row 293 of vacuum ports 114 that completely surrounds meniscus nozzles 116 and row 295 of vacuum ports 114 adjacent a central portion of the trailing edge 298 of proximity head 290. Vacuum ports 114 lying in first row 293 are connected to a common manifold as described above for zone 263 in FIG. 9A. Vacuum ports 114 lying in second row 295 are connected to one of one or more additional manifolds. In one embodiment, ports 114 in row 295 at zone 292 centrally disposed on the trailing side of proximity head 290 are connected to one manifold (not shown), and ports 114 in row 295 in zones 294 are connected to another manifold (not shown). Each manifold includes an independent connection to a vacuum source as described above with reference to FIG. 9A.

It should be noted that either or both the upper and lower proximity heads and the carrier can be controlled by a computer system such that the rate of travel of the carrier with respect to the proximity heads may be constant or vary depending on the position of the carrier with respect to the proximity heads. In some embodiments, for example, the rate of travel of the carrier may be slower as the meniscus transitions on and off the substrate, thereby providing additional time for meniscus liquid to be flow out of the carrier-substrate gap. In addition, the gas flow through gas nozzles 112, 252 (FIG. 8C) and vacuum supplied to vacuum ports 114 (FIGS. 9A-10) can be mechanically and/or computer controlled, either to time the activation/deactivation of suction, or to vary the flow rates depending on the relative position of the carrier with respect to the proximity heads. The computer control can be implemented using hardware logic or in conjunction with a multipurpose computer processor, using a computer program written to control the movement and/or application of suction. In certain embodiments, a computer program also controls the volume and/or constituents of fluid supplied to the meniscus. Therefore, the computer program can define fluid recipes specifically tailored to each of a plurality of given applications.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms such as producing, identifying, determining, or comparing.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Embodiments of the present invention can be processed on a single computer, or using multiple computers or computer components which are interconnected. A computer, as used herein, shall include a standalone computer system having its own processor(s), its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for processing a substrate, comprising:
moving a substrate in a linear direction simultaneously between a processing face of an upper proximity head and a processing face of a lower proximity head; and
as the substrate is moved in the linear direction simultaneously between the processing faces of the upper and lower proximity heads, generating a first meniscus of processing liquid between the processing face of the upper proximity head and a top surface of the substrate, and generating a second meniscus of processing liquid between the processing face of the lower proximity head and a bottom surface of the substrate,
wherein the first meniscus is generated to have a first meniscus protrusion that extends in the linear direction in which the substrate is moved and is positioned on a trailing side of the first meniscus relative to the linear direction in which the substrate is moved, and
wherein the first meniscus protrusion is centered on the substrate relative to a diameter of the substrate as measured perpendicular to the linear direction in which the substrate is moved.

2. The method of claim 1, wherein the processing face of the upper proximity head is positioned substantially parallel to the top surface of the substrate, and wherein the processing face of the lower proximity head is positioned substantially parallel to the bottom surface of the substrate.

3. The method of claim 1, further comprising:
applying vacuum from the upper proximity head along a trailing side of the first meniscus relative to the linear direction in which the substrate is moved to confine the first meniscus.

4. The method of claim 3, wherein the vacuum is applied from the upper proximity head to have a protrusion shape in a corresponding vacuum force at a position centered on the substrate relative to a diameter of the substrate as measured perpendicular to the linear direction in which the substrate is moved, whereby the protrusion shape in the vacuum applied from the upper proximity head enables generation of the first meniscus protrusion.

5. The method of claim 4, further comprising:
disposing gas from the upper proximity head in a substantially uniform manner within a first region that completely and conformally surrounds an outer periphery of the vacuum applied from the upper proximity head.

6. The method of claim 5, further comprising:
disposing additional gas from the upper proximity head in a first localized area outside of the first region in which gas is disposed.

7. The method of claim 6, wherein the first localized area is centered on the substrate relative to a diameter of the substrate as measured perpendicular to the linear direction in which the substrate is moved.

8. The method of claim 1, further comprising:
placing the substrate on a carrier having an opening sized for receiving the substrate and a plurality of support pins for supporting the substrate within the opening; and
moving the carrier in the linear direction to cause moving of the substrate in the linear direction.

9. The method of claim 8, further comprising:
evacuating processing liquids of the first and second meniscuses from a gap between a radial perimeter of the substrate and the carrier as the substrate is moved in the linear direction simultaneously between the processing face of the upper proximity head and the processing face of the lower proximity head.

10. The method of claim 1, wherein the first meniscus is generated such that the trailing side of the first meniscus is not a straight line tangent to a radial perimeter of the substrate when the first meniscus protrusion crosses the radial perimeter of the substrate.

\* \* \* \* \*